US008669642B2

(12) United States Patent
Son et al.

(10) Patent No.: US 8,669,642 B2
(45) Date of Patent: Mar. 11, 2014

(54) SEMICONDUCTOR CHIP AND FABRICATING METHOD THEREOF

(75) Inventors: Ho Young Son, Cheongju-si (KR); Tac Keun Oh, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 68 days.

(21) Appl. No.: 13/371,090

(22) Filed: Feb. 10, 2012

(65) Prior Publication Data

US 2012/0205816 A1    Aug. 16, 2012

(30) Foreign Application Priority Data

Feb. 11, 2011    (KR) .................. 10-2011-0012488

(51) Int. Cl.
*H01L 29/40* (2006.01)
*H01L 21/44* (2006.01)
*H01L 21/4763* (2006.01)

(52) U.S. Cl.
CPC ............ *H01L 29/40* (2013.01); *H01L 21/4763* (2013.01)
USPC .......................................... 257/621; 438/672

(58) Field of Classification Search
CPC ...... H01L 29/40; H01L 29/68; H01L 21/4763
USPC .................... 257/744, 621; 438/672
See application file for complete search history.

(56) References Cited

U.S. PATENT DOCUMENTS

| | | | | |
|---|---|---|---|---|
| 6,828,656 B2 * | 12/2004 | Forbes et al. | ................. | 257/621 |
| 6,914,527 B2 * | 7/2005 | Hsu | .............................. | 340/556 |
| 7,358,602 B2 * | 4/2008 | Hara | ............................. | 257/689 |
| 7,410,898 B2 * | 8/2008 | Kirby et al. | .................... | 438/667 |
| 8,232,115 B2 * | 7/2012 | Ding et al. | ...................... | 438/17 |
| 2008/0111213 A1 | 5/2008 | Akram et al. | | |
| 2011/0121427 A1 * | 5/2011 | Stupar et al. | .................. | 257/532 |

FOREIGN PATENT DOCUMENTS

| | | |
|---|---|---|
| JP | 10199974 A | 7/1998 |
| JP | 2006165112 A | 6/2006 |
| JP | 2008-085237 A | 4/2008 |

\* cited by examiner

*Primary Examiner* — William D Coleman
(74) *Attorney, Agent, or Firm* — William Park & Associates Patent Ltd.

(57) ABSTRACT

A semiconductor chip includes a substrate having a front surface and a back surface opposite the front surface, a conductive column part passing through the substrate from the front surface to the back surface, a cavity formed by removing a part of the back surface around an end portion of the conductive column part such that the end portion of the conductive column part protrudes from the cavity, a first insulation layer formed in the cavity such that a portion of the end portion of the conductive column part is exposed, and a back electrode electrically connected to the exposed end portion of the conductive column part.

20 Claims, 12 Drawing Sheets

SEMICONDUCTOR CHIP AND FABRICATING METHOD THEREOF

CROSS-REFERENCES TO RELATED APPLICATIONS

The present application claims priority under 35 U.S.C 119(a) to Korean Application No. 10-2011-0012488 filed on Feb. 11, 2011 in the Korean intellectual property Office, which is incorporated by reference in its entirety.

BACKGROUND

Exemplary embodiments of the present invention relate to a semiconductor chip and a fabricating method thereof, and more particularly, to a semiconductor chip capable of being used in electronic products that have the features of light weight, slim structure, and compact size, and a fabricating method including through silicon via (TSV) formation.

As ever higher performance electronic products are fabricated in small sizes and needs of portable mobile products have increased, there is an increasing demand for an ultra-miniaturized semiconductor memory with a high capacity. In general, in order to increase a storage capacity of a semiconductor memory, it is possible to use a method for increasing a storage capacity of a semiconductor memory by increasing the degree of integration of a semiconductor chip, and a method for mounting and assembling a plurality of semiconductor chips in one semiconductor package. In the former case, much effort, cost, and time are required. However, in the latter case, it is possible to increase a storage capacity of a semiconductor memory only by changing a packaging method. Furthermore, since the latter case has advantages in terms of required cost and research development effort and time as compared with the former case, semiconductor memory fabrication companies have made an effort to increase storage capacity of a semiconductor memory device through multi-chip packaging in which a plurality of semiconductor chips are mounted in one semiconductor package.

A method for mounting a plurality of semiconductor chips in one semiconductor package may be classified to a method for horizontally mounting the semiconductor chips and a method for vertically mounting the semiconductor chips. However, to keep up with the miniaturization trend of electronic products, most semiconductor memory fabrication companies have employed a stack-type multi-chip package in which semiconductor chips are vertically stacked.

Typically, a package structure using through silicon via (TSV) is used in a stack package. A package employing the through silicon via (TSV) has a structure in which through silicon vias are formed in each chip in a wafer level and physical and electrical connections between chips are made with the through silicon vias. In order to cope with multifunctional and high performance mobile appliances, and the like, research into a package employing an electrode has been actively conducted.

FIG. 1 is a sectional view of a through silicon via according to the conventional art. Referring to FIG. 1, a through silicon via 12 of a silicon wafer 10 includes a front electrode 14, a back electrode 16, and an insulation layer 18 for substantially preventing a leakage current between silicon and the back electrode 16. Since the diameter of the through silicon via 12 is reduced as semiconductor parts become smaller, an opening 18a of the insulation layer 18 may need to be small. If the opening 18a of the insulation layer 18 is not small, a silicon leakage part 10a occurs, resulting in leakage current. In order to substantially prevent the leakage current, a lithography process using a short wavelength and surface flatness may be needed. However, such equipment is expensive, thus increasing the product cost.

SUMMARY

An embodiment of the present invention generally relates to semiconductors, and more specifically to a semiconductor chip capable of efficiently preventing a leakage current even when the diameter of a through silicon via is reduced and a fabricating method thereof, regardless of equipment advancement including expensive lithography equipment.

In an embodiment of the invention, a substrate comprises a front surface and a back surface opposite the front surface. A conductive column part passes through the substrate from the front surface to the back surface and a cavity may be formed by removing a part of the back surface around an end portion of the conductive column part such that the end portion of the conductive column part protrudes from the cavity. A first insulation layer is formed in the cavity such that a portion of the end portion of the conductive column part is exposed, and a back electrode is electrically connected to the exposed end portion of the conductive column part.

Another embodiment of the invention may comprise a method of forming a conductive column part in a substrate having a front surface and a back surface opposite the front surface with the conductive column part passing through the substrate from the front surface to the back surface. A cavity may be formed by removing a portion of the substrate around an end portion of the conductive column part, and a first insulation layer formed by filling at least a part of the cavity. A back electrode may then be formed to be electrically connected to the end portion of the conductive column part.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Embodiments of the present invention will be described with reference to accompanying drawings. However, the embodiments are for illustrative purposes only and are not intended to limit the scope of the invention.

In a semiconductor chip according to an embodiment of the invention, a substrate is formed with a through silicon via, and the through silicon via may include a column part, a back electrode, and an insulation layer below the back electrode. The insulation layer may include one or more insulation layers (a first insulation layer, a second insulation layer, etc.), and may fill the whole or a part of a cavity obtained by removing a substrate around an end of one side of the column part.

The first insulation layer may coat the lower surface of the cavity and simultaneously coat the back surface of the substrate, may be formed to fill the whole of the cavity, or may be formed to fill a part of the cavity. The first insulation layer and/or the second insulation layer may be formed of an organic insulation material including, for example, photoresist, thermosetting resin, photo-curing resin, and the like, or an inorganic insulation material. The first insulation layer and/or the second insulation layer may be formed of substantially the same material or materials different from each other. Furthermore, the column part may include a plurality of columns.

Various embodiments of the present invention will be described with reference to accompanying drawings. FIG. 2a to FIG. 2e are sectional views illustrating a method for fabricating a semiconductor chip according to an embodiment.

Figure 1:
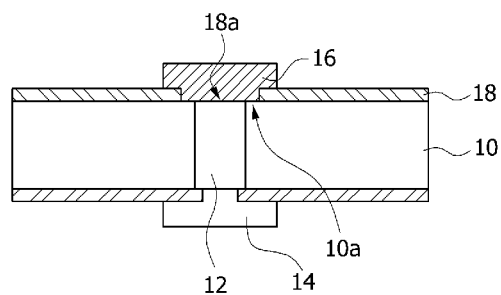
FIG. 1 is a sectional view of a through silicon via according to the conventional art.
Figure 2A:
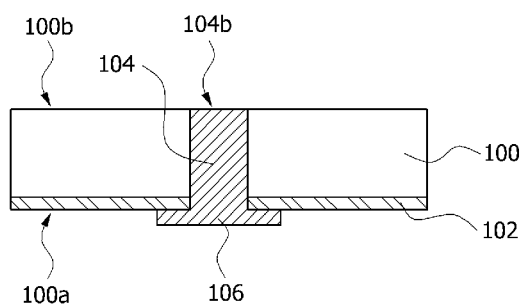
FIG. 2a to FIG. 2e are sectional views illustrating an exemplary method for fabricating a semiconductor chip according to an embodiment of the invention.

Referring to FIG. 2a, a column part 104 is formed in a substrate 100 by making a hole in the substrate 100 and then filling the hole with conductive material. The substrate 100 comprises a front surface 100a and a back surface 100b opposite the front surface 100a. A front insulation film 102, a front electrode 106, and the like may exist on the front surface 100a as shown.

The substrate 100 electrically connects a semiconductor chip in a package to an external printed circuit board (PCB), and may include a package substrate for supporting the semiconductor chip, a printed circuit board itself, or a wafer from which the semiconductor chip is generated. In terms of a material, the substrate 100 may be, for example, a ceramic substrate, a plastic substrate including epoxy core, an electric interconnection, and the like, or a wafer in which an interconnection and the like are formed on a backing material made, for example, of silicon (Si), GaAs, $LiTaO_3$, $LiNbO_3$, sapphire, and the like. For convenience, the substrate 100 will be described as a silicon wafer.

The conductive material in the column part 104 may include one or more metals, conductive organic materials, and the like, such as, for example, gold (Au), silver (Au), copper (Cu), aluminum (Al), nickel (Ni), tungsten (W), titanium (Ti), platinum (Pt), palladium (Pd), in (Sn), lead (Pb), zinc (Zn), indium (In), cadmium (Cd), chrome (Cr), and molybdenum (Mo). The conductive material may also be used in a multi-layer structure as well as a single layer structure. Furthermore, the conductive material may fill the whole or a part of a hole passing through the substrate 100.

According to an example of a method for forming the column part 104, a bonding pad (not illustrated) may be formed on the front surface 100a of the substrate 100, and a hole formed at a part adjacent to the bonding pad. The groove may be formed using a method such as a laser drill or deep reactive ion etching (DRIE), and may have a vertical shape or a tapered shape. Furthermore, after the hole is formed, chemical treatment or physical treatment may be performed such that residue from formation of the hole is removed and a subsequent plating process can be appropriately performed, resulting in the improvement of plating adherence property. Then, a seed metal film is formed, and a conductive material is filled in the hole through electrolytic plating, so that the column part 104 may be formed.

Figure 2B:
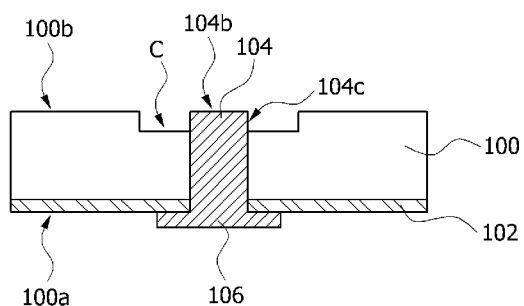

Referring to FIG. 2b, a part of the back surface 100b is removed to expose the end portion 104b of the column part. The removed portion may leave a cavity C in the back surface 100b. Parts of the back surface 100b may be removed, for example, through a grinding process, and the grinding process may be performed such that the exposed end portion 104b is level with the back surface 100b of the substrate. The grinding process may be performed by a typical grinding apparatus for fabricating a semiconductor device. For example, the grinding process may be performed by a grinding apparatus including a loading area, a roughing area, a finishing area, an unloading area, and the like in sequence of roughing the back surface 100b of the loaded substrate, finishing for smoothly grinding the back surface 100b of the substrate, and unloading for unloading the substrate.

Although not illustrated in FIG. 2b, a carrier wafer may be attached to the front surface 100a using an adhesive layer. The carrier wafer may be formed, for example, of a glass material or a silicon material. The carrier wafer is temporarily attached in order to facilitate handling for the substrate 100 thinned after the back surface 100b is removed by a predetermined thickness, and is attached using an adhesive layer including adhesive which may be easily removed later.

The cavity C with predetermined depth and width is formed around the end 104b of one side of the column part to allow the end 104b of one side of the column part to protrude from the back surface 100b of the substrate. A side surface 104c of the column part is also exposed by the cavity C. The cavity C may be formed by coating photoresist, removing photoresist in an area where the cavity C is to be formed while leaving photoresist in other areas through an exposure and development process, and performing an etching process using the remaining photoresist as an etching mask. The etching may use dry etching, wet etching, and the like. The dry etching may use an etching gas such as $CF_4$, $SF_6$, $NF_3$, $Cl_2$, or $CCl_2F_2$, and the wet etching may use a mixture solution of nitric acid, acetic acid, and fluoric acid. However, the present invention is not limited thereto.

Figure 2C:
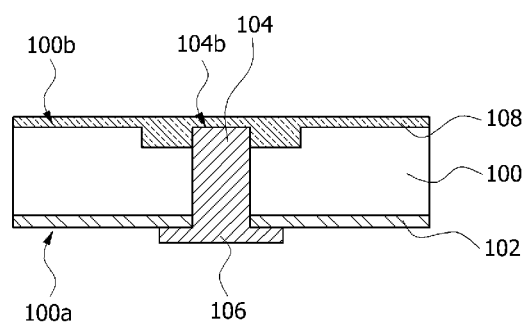

Referring to FIG. 2c, a first insulation layer 108 is used to fill the cavity C and coat the back surface 100b of the wafer and the end portion 104b. The first insulation layer 108 may include one or more of an organic insulation material and an inorganic insulation material. For example, the organic insulation material may include polyimide, benzocyclobutene, photoacryl, polyester, polyarylene ether, perfluoro cyclobutane, parylene, photoresistive resin including photoresist, SiOCH, SiCHN, SiCH, and the like. The inorganic insulation material may include, for example, silicon oxide, silicon nitride, silicon acid nitride, silicon carbide, metal oxide, SiC, SiCN, and the like. However, the present invention is not limited thereto and may comprise other suitable material. The coating of the insulation material may be performed using, for example, a thin film formation method such as spin coating, dip coating, sol-gel coating, spray coating, vacuum deposition, sputtering, or chemical vapor deposition (CVD).

The photoresist may include sensitizer sensitive to light, resin serving as the body of a thin film, organic solvent for melting resin, and the like, and both positive photoresist and negative photoresist may be used. In the case of the positive photoresist, resin may use, for example, novolac-resole resin, phenol resin, and the like, and sensitizer may use diazoquinone, polymethyl methacrylate (PMMA), derivatives thereof, and the like. In the case of the negative photoresist, resin may use, for example, polyvinyl cinnamate, 2,3-dichloro-1-prophy-acrylate (DCPA), allylester prepolymer, and the like.

The SiOCH, SiCHN, and SiCH may be an organic insulation material grown using a polyorganosilane through a plasma CVD method. An available polyorganosilane may include one more polyorganosilanes such as, for example, trimetylvinylsilane, triethylvinylsilane, dimetyldivinylsilane, diethyldivinylsilane, metyltrivinylsilane, ethyltrivinylsilane, tetravinylsilane, tetraethylsilane, and triethylsilane.

Figure 2D:
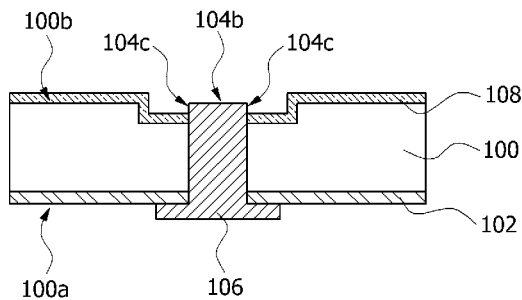

Referring to FIG. 2d, the first insulation layer 108 is patterned to expose the upper area of the column part (allow the end 104b of one side of the column part to protrude). The exposed upper area of the column part includes the end portion 104b and may further include a side surface 104c of the column part. The patterning of the first insulation layer 108 may be selected according to the type of an insulation material constituting the first insulation layer 108.

For example, when the insulation material is photoresist, it may be possible to use a method for adjusting exposure conditions to allow only a part of the thickness of the photoresist layer 108 to be exposed, and performing a development process. That is, the method may include coating the photoresist layer, exposing a part of the thickness of the photoresist layer, and developing the exposed photoresist layer. For another example, when the insulation material is silicon oxide $SiO_2$, photoresist may be coated on the silicon oxide and may be patterned through an exposure and development process to remove photoresist on the upper area of the column part, and the first insulation layer may be removed through a dry etching process using, for example, $C_2F_6$ gas and $CF_4/H_2$ gas, or a wet etching process using, for example, buffered HF (BHF) to expose the upper area of the column part. Then, remaining photoresist may be removed using a well-known art such as $O_2$ plasma ashing.

Figure 2E:
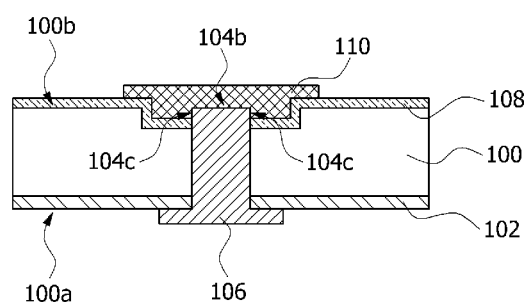

Referring to FIG. 2e, a back electrode 110 is formed by, for example, filling the cavity C. That is, the back electrode 110 is formed to coat the end portion 104b and the side surface 104c. The back electrode 110 may be a single layer, or multiple layers including one or more metals, conductive organic materials, and the like. Each of the layers may comprise at least one of gold (Au), silver (Au), copper (Cu), aluminum (Al), nickel (Ni), tungsten (W), titanium (Ti), platinum (Pt), palladium (Pd), in (Sn), lead (Pb), zinc (Zn), indium (In), cadmium (Cd), chrome (Cr), and molybdenum (Mo). The back electrode 110 may be formed using, for example, non-electrolytic plating, electrolytic plating, vacuum deposition, sputtering, and the like.

As an example, the back electrode 110 may have a shape as illustrated in FIG. 2e by depositing a conductive metal thin film, coating photoresist on the conductive metal thin film, patterning the photoresist through exposure, development and the like, and etching the metal thin film by using the patterned photoresist as an etching mask.

For another example, a copper thin film may be formed through non-electrolytic plating. A plating solution used in the non-electrolytic plating may include a copper ion source, a pH control agent, and a reducing agent, and may include ethylenediamine tetraacetic acid (EDTA), a surface active agent, and the like as a complexing agent. The copper ion source may include, for example, $CuSO_4.5H_2O$, $CuSO_4$ and the like, the pH control agent may include KOH, NaOH and the like, and the reducing agent may include formaldehyde and the like. However, the present invention is not limited thereto. Other appropriate material may be used. The non-electrolytic plating may be performed when copper is reduced by a reducing agent (formaldehyde) through the following reaction.

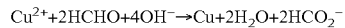

Furthermore, it may be possible to use a catalyst such as palladium (Pd) or a palladium-tin (Pd/Sn) compound. If pH is increased to, for example, about pH 10 or more by sodium hydroxide, electrons are generated due to strong reduction reaction of formaldehyde. These electrons flow to copper ions, and the copper ions are precipitated on a palladium catalyst, so that a copper layer may be coated.

For another example, the back electrode 110 may also be formed through electrolytic plating. In general, thin film formation using the electrolytic plating has advantages in that a thin film formation speed is fast and it may be performed at a low temperature, as compared with physical vapor deposition (PVD) or chemical vapor deposition (CVD). Through the electrolytic plating, it may be possible to form the back electrode 110 including a single layer of copper, a metal film obtained by sequentially stacking copper, nickel and gold, and the like. However, the present invention is not limited thereto and may use other methods to form the back electrode 110.

In an example of electrolytic copper plating, an electrolytic plating solution may include, for example, a copper ion source, sulphuric acid ($H_2SO_4$) for adjusting electric conductivity, hydrochloric acid (HCl) for adjusting a reduction reaction, and the like, and further include other additives. That is, if $CuSO_4$ is put into sulphuric acid ($H_2SO_4$) and water as the copper ion source, $CuSO_4$ is dissolved into $Cu^{2+}$ ions and $SO_4^{2-}$ ions. If the column part 104 is connected to the cathode and is immersed in a plating tank, the column part 104 may serve as a seed layer, resulting in the generation of copper layer. No limitation exists in a method for forming a nickel layer using electrolytic plating. For example, it may be possible to use an aqueous solution including $NiSO_4.6H_2O$ 120 to 230 g/L, $NiCL_2$ 5 to 35 g/L, and $H_3PO_4$ 5 to 35 g/L, or an aqueous solution including $NiSO_4.6H_2O$ 120 to 230 g/L, $Na_4Cl$ 10 to 30 g/L, and $ZnSO_4.7H_2O$ 20 to 50 g/L. When the aqueous solution temperature is approximately 25 to 50° C. and pH is approximately 4 to 7, the nickel layer may be formed. However, the present invention is not limited thereto and other appropriate methods may be used to form the nickel layer.

Electrolytic gold plating may be performed in order to improve the electrical characteristics, and an activation process may be first performed on a nickel surface in order to facilitate the attachment of gold. A gold-copper component may be easily abraded. If copper is directly plated with gold, since a gold component moves into the copper and a copper component moves into the gold, conductivity using gold plating may not be improved. In this regard, it may be preferable to perform nickel plating before electrolytic gold plating. In relation to a plating solution for the electrolytic gold plating, chloroaurate or gold sulfate may be used as a gold source, and a cyanide or non-cyanide compound may be used as a chelating agent. However, in the present invention, no limitation exists in the plating solution for the electrolytic gold plating.

A method for fabricating a semiconductor chip according to another exemplary embodiment of the invention will be described with reference to FIG. 3a to FIG. 3e, and any redundant description will be omitted or will be briefly given.

Figure 3A:
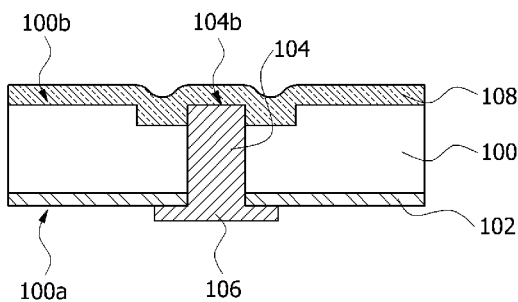
FIG. 3a to FIG. 3e are sectional views illustrating an exemplary method for fabricating a semiconductor chip according to another embodiment of the invention.

Referring to FIG. 3a, similarly to FIG. 2a to FIG. 2c, a column part 104 is formed in the substrate 100, a cavity C is formed on the back surface 100b of the substrate, and a first insulation layer 108 is formed to coat the cavity C and the back surface 100b. The material and the formation method of the first insulation layer 108 may be substantially the same as described with respect to FIGS. 2a to 2e.

Figure 3B:
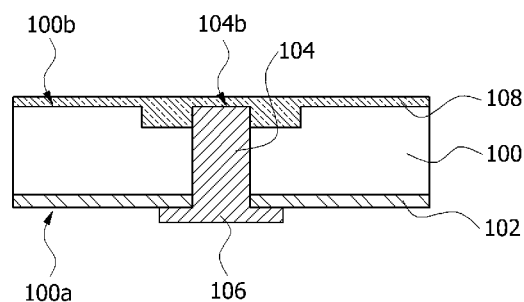

Referring to FIG. 3b, a planarization process may be performed on the first insulation layer 108 through chemical mechanical polishing (CMP), grinding, etch back, and the like. As the occasion demands, the planarization process may not be performed.

For example, when the first insulation layer 108 is silicon oxide $SiO_2$ or metal oxide, the planarization process may be performed through the chemical mechanical polishing. The chemical mechanical polishing may be performed in such a manner that a wafer is allowed to reciprocate and rotate while supplying slurry to a polishing pad, wherein the slurry includes a processing solution, such as, for example, KOH, NaOH or $NH_4OH$, which chemically reacts with silicon oxide or metal oxide, a dispersing agent for dispersing polishing particles, an antifoaming agent for suppressing bubbles, and another buffer agent in an abradant such as, for example, alumina ($Al_2O_3$), zirconium dioxide ($ZrO_2$), cesium oxide ($CeO_2$), or silicon dioxide ($SiO_2$). For another example, photoresist or polyimide may be coated on the first insulation layer 108, and a plasma etching process may be performed using $O_2$ or $CF_4/O_2$ until the first insulation layer 108 is exposed and may be continued by adjusting the etching rate of the first insulation layer 108 to be substantially equal to that of the photoresist or the polyimide until the photoresist or the polyimide is etched so that the first insulation layer 108 may be planarized.

Meanwhile, when the first insulation layer 108 is an organic material formed through spin coating and the like, since it is highly probable that the coated upper surface of the first insulation layer 108 has been planarized, the planarization process may be omitted. When the planarization process is performed, the first insulation layer 108 may be planarized through, for example, a grinding process.

Figure 3C:
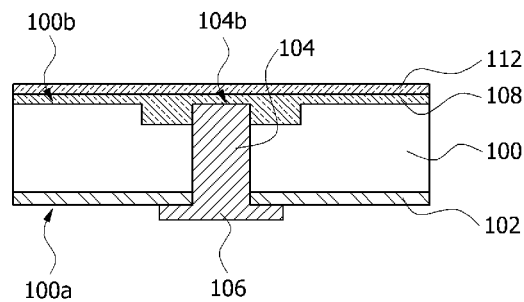

Referring to FIG. 3c, a second insulation layer 112 is coated on the first insulation layer 108.

The second insulation layer 112 may include one or more of an organic insulation material and an inorganic insulation material, and may include a material substantially equal to or different from that of the first insulation layer 108. For example, the organic insulation material may include polyimide, benxocyclobutene, photoacryl, polyester, parylene, sensitive resin including photoresist, SiOCH, SiCHN, SiCH, and the like, and the inorganic insulation material may include silicon oxide, silicon nitride, silicon acid nitride, silicon carbide, metal oxide, SiC, SiCN and the like. However, the present invention is not limited thereto and other appropriate material may be used. The coating of the insulation material may be performed using, for example, a thin film formation method such as spin coating, dip coating, sol-gel coating, spray coating, vacuum deposition, sputtering, or CVD.

Figure 3D:
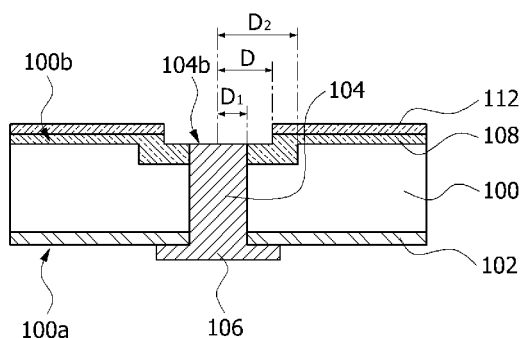

Referring to FIG. 3d, the whole of the thickness of the second insulation layer 112 and a part of the thickness of the first insulation layer 108 are removed to expose the end portion 104b of the column part 104. The exposed end portion 104b (an area from which the first insulation layer and the second insulation layer are removed) may be larger than a sectional area of the column part, and smaller than a sectional area of the cavity. That is, the distance D from the center axis of the column part to the periphery of the exposed upper area of the column part is larger than the distance $D_1$ from the center axis of the column part to the periphery of the column part, and is smaller than the distance $D_2$ from the center axis of the column part to the periphery of the cavity.

The removal of the second insulation layer 112 and the first insulation layer 108 may be selected according to the type of insulation constituting the second insulation layer 112 and the first insulation layer 108. For example, when the insulation material is photoresist, it may be possible to use a method such as exposure or development, or a method for removing a specific part using laser ablation. For another example, when the insulation material is silicon oxide $SiO_2$, photoresist may be coated on the silicon oxide and may be patterned through an exposure and development process to remove photoresist on the upper area of the column part, and the first insulation layer and the second insulation layer may be removed through a dry etching process using $C_2F_6$ gas and $CF_4/H_2$ gas or a wet etching process using buffered HF (BHF) to expose the upper area of the column part. Then, remaining photoresist may be removed using a well-known art such as $O_2$ plasma ashing.

Figure 3E:
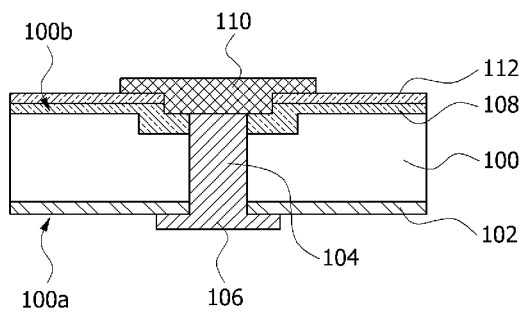

Referring to FIG. 3e, a back electrode 110 is formed on the exposed end portion 104b. The material and the formation method of the back electrode 110 are substantially the same as the above description.

Figure 4A:
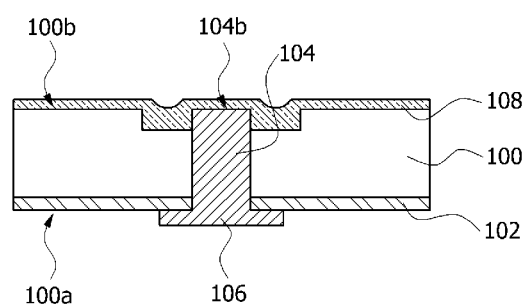
FIG. 4a to FIG. 4c are sectional views illustrating an exemplary method for fabricating a semiconductor chip according to another embodiment of the invention.
Figure 4B:
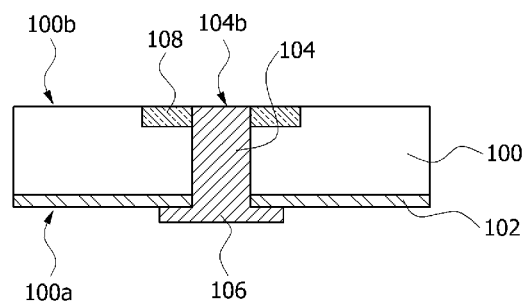
Figure 4C:
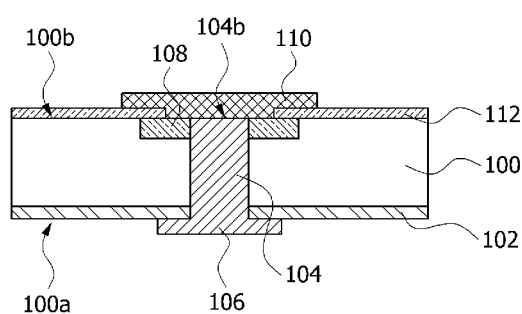

FIG. 4a to FIG. 4c are sectional views illustrating an exemplary method for fabricating a semiconductor chip according to another embodiment of the invention.

Referring to FIG. 4a, similarly to FIG. 2a to FIG. 2c, the column part 104 is formed in the substrate 100, the cavity C is formed at the side of the back surface 100b of the substrate, and the first insulation layer 108 is coated to fill the cavity C and simultaneously coat the back surface 100b of the substrate.

Referring to FIG. 4b, the first insulation layer may be patterned such that the first insulation layer 108 in the cavity C remains and the first insulation layer existing in other areas is removed. The patterning of the first insulation layer 108 may be selected according to the type of insulation constituting the first insulation layer 108.

For example, when the insulation material is photoresist, exposure conditions may be adjusted such that the back surface 100b of the substrate is also exposed, and a development process is performed so that all photoresist existing at the periphery of the cavity is removed and the whole or a part of the thickness of photoresist existing in the cavity C remains. Furthermore, it may be possible to use a method for removing photoresist on the back surface 100b of the wafer and the end portion 104b of one side of the column part through laser ablation. For another example, when the insulation material is silicon oxide, silicon nitride, or metal oxide, the first insulation layer 108 may be patterned by performing dry etching or we etching (etch back) without using an etching mask until the end portion 104b and the back surface 100b of the substrate are exposed. For another example, chemical mechanical polishing may also be performed until the end portion 104b and the back surface 100b of the wafer are exposed.

Referring to FIG. 4c, as described above, a second insulation layer 112 and an electrode 110 are formed, thereby forming a through silicon via. In addition, an additional insulation layer may be further formed on the second insulation layer 112.

A method for fabricating a semiconductor chip according to another exemplary embodiment of the invention will be described with reference to FIG. 5a to FIG. 5c, and redundant description will be omitted or will be briefly given.

Figure 5A:
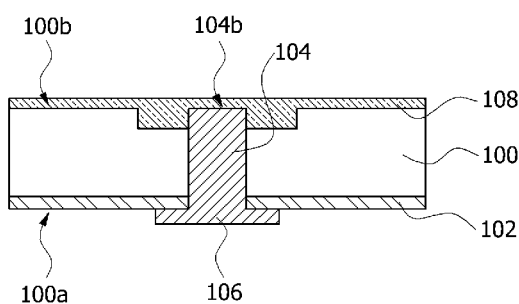
FIG. 5a to FIG. 5c are sectional views illustrating an exemplary method for fabricating a semiconductor chip according to another embodiment of the invention.

Referring to FIG. 5a, similarly to FIG. 2a to FIG. 2c, a cavity C with predetermined depth and width is formed around the end portion 104b to expose the end portion 104b and the side surface 104c.

Figure 5B:
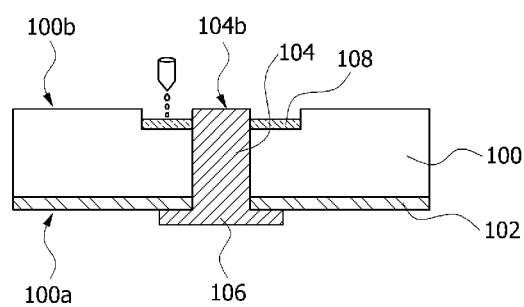

Referring to FIG. 5b, the first insulation layer 108 may be formed to fill the whole or a part of the thickness of the cavity C, where the first insulation layer 108 may be formed in the cavity C without a separate patterning process. The first insulation layer 108 may include one or more of an organic insulation material and an inorganic insulation material, and may be formed through dispensing, screen printing, and the like.

For example, the first insulation layer 108 may be formed by coating an organic insulation material including, for example, thermosetting resin or photo-curing resin in the cavity C through dispensing, screen printing, and the like, and curing (thermosetting or photo-curing) the organic insulation material. For example, the thermosetting resin may include phenol resin, epoxy resin, and the like. However, the present invention is not limited thereto and may use other suitable material. For another example, the first insulation layer 108 may be formed by coating an inorganic insulation material paste including silicon oxide, metal oxide and the like in the cavity C through screen printing, and performing drying and sintering.

Figure 5C:
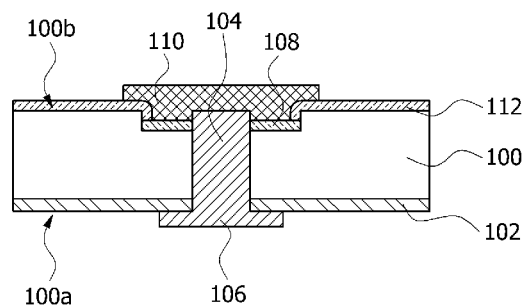

Referring to FIG. 5c, a second insulation layer 112 and a back electrode 110 may be formed in the same manner as described above.

A method for fabricating a semiconductor chip according to another exemplary embodiment of the invention will be described with reference to FIG. 6a to FIG. 6d, and redundant description will be omitted or will be briefly given.

Figure 6A:
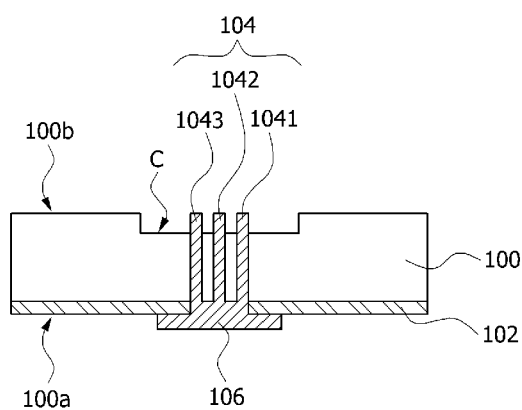
FIG. 6a to FIG. 6d are sectional views illustrating a method for fabricating an exemplary semiconductor chip according to another embodiment of the invention.

Referring to FIG. 6a, the column part 104 having three columns 1041 to 1043 is formed in the substrate 100 provided with the front surface 100a and the back surface 100b, a carrier substrate (not illustrated) is attached, back grinding is performed, and the cavity C is formed.

Figure 6B:
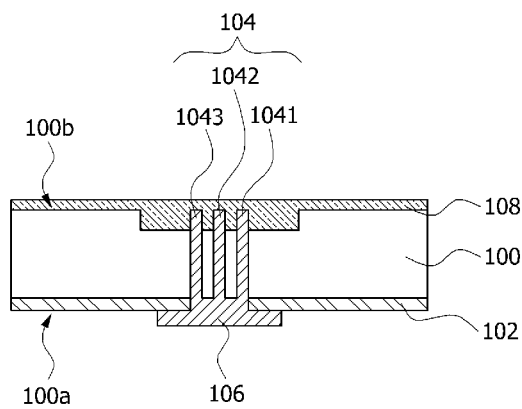

Referring to FIG. 6b, the first insulation layer 108 is formed to coat the cavity C and the back surface 100b. The material and the formation method of the first insulation layer 108 are substantially the same as the above description.

Figure 6C:
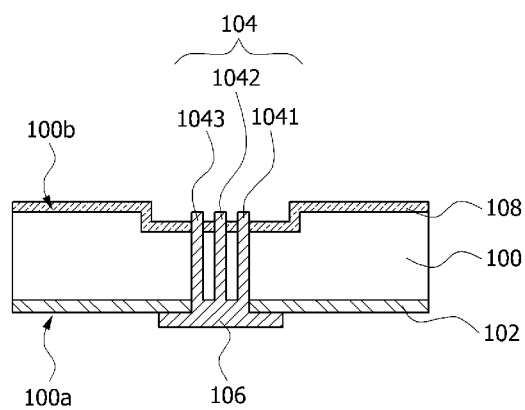

Referring to FIG. 6c, the first insulation layer 108 is patterned to expose an upper area of each of the three columns 1041 to 1043 of the column part 104. The exposed upper area of the column part 104 may include an end portion of the column part and a side surface of the end portion of the column part. The patterning of the first insulation layer 108 may be selected according to the type of an insulation material constituting the first insulation layer 108, and detailed description thereof will be omitted. The patterning process may also be omitted using a curable organic material such as, for example, thermosetting resin or photo-curing resin as described above.

Figure 6D:
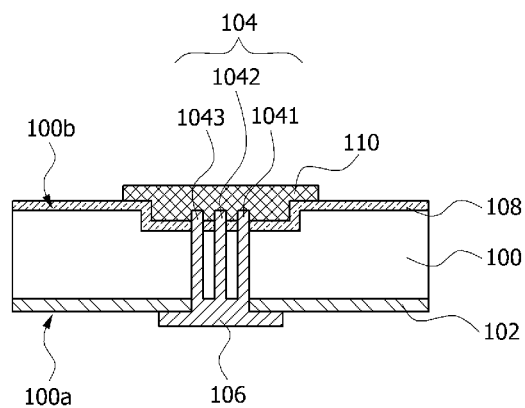

Referring to FIG. 6d, a back electrode 110 is formed on the first insulation layer 108. The material and the formation method of the back electrode 110 are substantially the same as the above description. Additionally, while the column part 104 was described as comprising the three columns 1041 to 1043, the invention need not be so limited. For example, the column part 104 may comprise two columns, or the column part 104 may comprise more than three columns.

Figure 7:
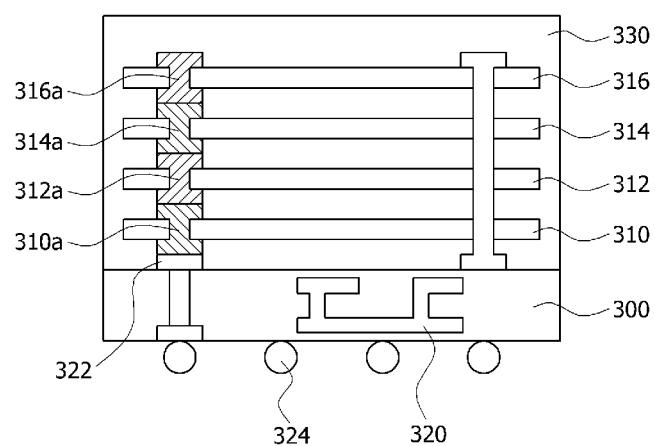
FIG. 7 is a sectional view illustrating an exemplary stack package according to an embodiment of the invention.

FIG. 7 is a sectional view illustrating a semiconductor chip stack package according to an exemplary embodiment of the invention, and briefly illustrates the semiconductor chip stack package for the purpose of convenience.

Referring to FIG. 7, a plurality of semiconductor chips 310, 312, 314, and 316 are sequentially stacked on a package substrate 300. However, the number of the semiconductor chips may be smaller than four or may exceed four.

The package substrate 300 electrically connects the semiconductor chips 310, 312, 314, and 316 in the package to an external printed circuit board (PCB) and supports the semiconductor chips 310, 312, 314, and 316. The package substrate 300 may be any suitable substrate such as, for example, a plastic substrate, a ceramic substrate, and the like. In an example, the package substrate 300 may be a plastic substrate including epoxy core, an electric interconnection, and the like. For another example, the package substrate 300 may be a printed circuit board in which the semiconductor chips 310, 312, 314, and 316 are mounted through a wafer level package process, and may be a flexible printed circuit board, a rigid printed circuit board, or a combination thereof.

The package substrate 300 may be provided with internal connections 320 and connection terminals 322. The connection terminals 322 may be formed on one surface of the package substrate 300, and solder balls 324 may be formed on the other surface of the package substrate 300. The connection terminals 322 may be electrically connected to the solder balls 324 through the internal connections 320 of the package substrate 300. For another example, the solder ball 324 may be replaced with a conductive bump such as a solder bump.

Through silicon vias 310a, 312a, 314a, and 316a formed using the above through silicon via formation method exist in the semiconductor chips 310, 312, 314, and 316, and may be electrically connected to one another through, for example, a solder paste, a solder bump, a conductive adhesive layer (not illustrated), and the like. Furthermore, the semiconductor chips may be a same type of chips, such as, for example, memory chips such as flash memories, MRAM(Magnetoresistive Random-Access Memory)s, ReRAM(Resistive Random-Access Memory)s, FRAM(Ferroelectric Random Access Memory)s, or DRAM(Dynamic Random Access Memory)s comprising transistors, capacitors, and interconnections for connecting these elements to each other. The semiconductor chips may also include different types of memory chips, such as, for example, flash memories and DRAMs. Furthermore, the semiconductor chips may comprise, for example, memory chips and logic chip.

The semiconductor chip 316 may be provided with a control chip (not illustrated), and may be molded with a molding member 330 such as epoxy molding compound. The control chip may include logic circuits such as SER/DES circuits.

In accordance with the semiconductor chip and the fabricating method according to an embodiment of the invention, it is possible to efficiently prevent a leakage current even when the diameter of a through silicon via is reduced, regardless of equipment advancement including expensive lithography equipment, and it is possible to substantially prevent an increase in the manufacturing cost due to the light weight, slim structure and compact size of semiconductor parts.

The embodiments of the present invention have been disclosed above for illustrative purposes. Those skilled in the art will appreciate that various modifications, additions, and substitutions are possible, without departing from the scope and spirit of the invention as disclosed in the accompanying claims.

What is claimed is:
1. A semiconductor chip comprising:
a substrate having a front surface and a back surface opposite the front surface;
a conductive column part passing through the substrate from the front surface to the back surface; and
a bank electrode electrically connected to the exposed end portion of the conductive column part,
wherein the substrate has a cavity formed by removing a part of the back surface around an end portion of the conductive column part such that the end portion of the conductive column part protrudes from the cavity, and a first insulation layer is formed in the cavity such that a portion of the end portion of the conductive column part is exposed.

2. The semiconductor chip of claim 1, wherein the first insulation layer coats the cavity and the back surface of the substrate.

3. The semiconductor chip of claim 1, wherein the first insulation layer includes an organic insulation material including photoresist.

4. The semiconductor chip of claim 1, wherein the back electrode covers a part of an upper surface of the first insulation layer.

5. The semiconductor chip of claim 1, wherein the conductive column part includes a plurality of columns spaced apart from one another.

6. The semiconductor chip of claim 1, further comprising:
a second insulation layer formed on the first insulation layer, a part of an upper surface of the second insulation layer being coated with the back electrode.

7. The semiconductor chip of claim 6, wherein the first insulation layer and the second insulation layer are formed from substantially the same type of material.

8. A method for fabricating a semiconductor chip, the method comprising:
forming a conductive column part in a substrate having a front surface and a back surface opposite the front surface, and the conductive column part passing through the substrate from the front surface to the back surface;
forming a cavity by removing a portion of the substrate around an end portion of the conductive column part leaving the end portion of the conductive column part protruding from the cavity;
forming a first insulation layer filling at least a part of the cavity; and
forming a back electrode electrically connected to the end portion of the conductive column part.

9. The method of claim 8, wherein, the first insulation layer coats at least a portion of the cavity and the back surface of the substrate.

10. The method of claim 8, wherein the forming of the first insulation layer comprises:
coating a photoresist layer;
exposing a part of a thickness of the photoresist layer; and
developing the exposed photoresist layer.

11. The method of claim 8, wherein an upper surface of the first insulation layer is level with the back surface of the substrate.

12. The method of claim 8, wherein forming the first insulation layer comprises:
coating a portion of the back surface; and
removing the first insulation layer except the first insulation layer in the cavity.

13. The method of claim 8, wherein forming the first insulation layer comprises:
coating an organic insulation material in the cavity; and
curing the organic insulation material.

14. The method of claim 8, wherein forming the first insulation layer comprises:
coating a first insulation layer;
coating a second insulation layer on the first insulation layer; and
removing at least a portion of the second insulation layer and the first insulation layer to expose at least a portion of the end portion of the conductive column part.

15. The method of claim 8, wherein the conductive column part comprises a plurality of columns spaced apart from one another.

16. The method of claim 12, comprising:
forming a second insulation layer coating a part of an upper surface of the first insulation layer and the back surface of the substrate.

17. The method of claim 13, wherein the organic insulation material includes one or more of thermosetting resin and photo-curing resin.

18. The method of claim 13, comprising:
forming a second insulation layer coating a part of an upper surface of the first insulation layer and the back surface of the substrate.

19. The method of claim 14, wherein the first insulation layer and the second insulation layer are formed from substantially the same type of material.

20. The method of claim 14, wherein, in the exposing at least a portion of the end portion of the conductive column part, the first insulation layer and the second insulation layer are removed from an area larger than a sectional area of the conductive column part and smaller than a sectional area of the cavity.

* * * * *

UNITED STATES PATENT AND TRADEMARK OFFICE
CERTIFICATE OF CORRECTION

PATENT NO. : 8,669,642 B2
APPLICATION NO. : 13/371090
DATED : March 11, 2014
INVENTOR(S) : Ho Young Son et al.

It is certified that error appears in the above-identified patent and that said Letters Patent is hereby corrected as shown below:

In the Claims

Column 10, line 62, which stated "bank electrode" instead of "back electrode" should read 1. (Currently amended) A semiconductor chip comprising:
a substrate having a front surface and a back surface opposite the front surface;
a conductive column part passing through the substrate from the front surface to the back surface; and
a [[bank]] --back-- electrode electrically connected to the exposed end portion of the conductive column part,
wherein the substrate has a cavity formed by removing a part of the back surface around an end portion of the conductive column part such that the end portion of the conductive column part protrudes from the cavity, and
a first insulation layer is formed in the cavity such that a portion of the end portion of the conductive column part is exposed.

Signed and Sealed this
Eighth Day of July, 2014

Michelle K. Lee
*Deputy Director of the United States Patent and Trademark Office*